(12) United States Patent
Kim et al.

(10) Patent No.: US 6,652,911 B2
(45) Date of Patent: *Nov. 25, 2003

(54) METHOD OF AND APPARATUS FOR COATING A WAFER WITH A MINIMAL LAYER OF PHOTORESIST

(75) Inventors: Moon-woo Kim, Kyungki-do (KR); Byung-joo Youn, Seoul (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,557

(22) Filed: Oct. 28, 1999

(65) Prior Publication Data

US 2002/0031604 A1 Mar. 14, 2002

Related U.S. Application Data

(62) Division of application No. 09/113,514, filed on Jul. 10, 1998, now Pat. No. 6,113,697.

(30) Foreign Application Priority Data

Jul. 25, 1997 (KR) .............................. 97-35179

(51) Int. Cl.$^7$ ............................ B05D 3/12; B05D 1/42
(52) U.S. Cl. ...................... 427/240; 427/425; 118/52; 118/320; 438/758
(58) Field of Search ............................... 427/240, 425, 427/385.5, 758; 118/52, 320

(56) References Cited

U.S. PATENT DOCUMENTS

| | | | | |
|---|---|---|---|---|
| 5,902,399 A | * | 5/1999 | Courtenay | 118/52 |
| 6,013,315 A | * | 1/2000 | Mandal | 427/240 |
| 6,025,012 A | * | 2/2000 | Matsuda et al. | 427/9 |

* cited by examiner

*Primary Examiner*—Shrive P. Beck
*Assistant Examiner*—Kirsten Crockford Jolley
(74) *Attorney, Agent, or Firm*—Volentine Francos, PLLC

(57) ABSTRACT

In a photoresist coating apparatus and method, a rotating wafer is scanned with a spray nozzle from which the photoresist issues. The rotational speed of the wafer is varied based on the relative position of the nozzle above the wafer. The varying of the rotational speed is designed to minimize the amount of photoresist necessary for coating the wafer. Specifically, the photoresist is sprayed from the nozzle while the nozzle scans the wafer in a direction from the peripheral edge of the wafer toward its center, and the rotational speed of the wafer is increased during such scanning.

7 Claims, 3 Drawing Sheets

METHOD OF AND APPARATUS FOR COATING A WAFER WITH A MINIMAL LAYER OF PHOTORESIST

CROSS REFERENCE TO RELATED APPLICATIONS

This is a divisional application of application Ser. No. 09/113,514, filed Jul. 10, 1998, now U.S. Pat. No. 6,113,697, which is hereby incorporated by reference in its entirety for all purposes.

BACKGROUND OF THE INVENTION

1. Field of the Invention

The present invention relates to a method of and apparatus for coating a wafer with a photoresist. More particularly, the present invention relates to minimizing the amount of photoresist necessary to coat a wafer supported for rotation beneath a nozzle from which the photoresist is sprayed.

2. Description of the Related Art

The semiconductor device fabrication process, in which wafers are processed into semiconductor devices having electrical characteristics, invariably includes many steps of coating the wafer with a photoresist. The photoresist is used for masking the wafer during various processes, including, among others, an etching process, an ion implantation process and a metalization process.

The photoresist is applied to the wafer by a spin coater. The spin coater comprises a pumping part for withdrawing photoresist from a supply source and a coating part for spraying the photoresist onto the wafer.

The pumping of the photoresist from the supply source is carried out using a pressurized nitrogen method. Furthermore, as shown in FIG. 1, the coating part includes a nozzle 14 fixed at a specific location over the wafer 12. The wafer 12 is mounted on a rotary chuck 10. The photoresist is sprayed from the nozzle 14, and the resulting thickness of the photoresist on the wafer 12 is dependent on the rate of rotation of the rotary chuck 10.

As shown in FIG. 1, the photoresist sprayed toward the upper central portion of the wafer 12 spreads toward the periphery of the rotating wafer. This is how the periphery of the wafer 12 is coated with the photoresist.

However, in the prior art as described above, 7 cc~9 cc of photoresist is sprayed from the nozzle 14 to provide a layer of photoresist on a wafer. This amount exceeds the amount which is actually necessary (less than 1 cc) for forming a layer of photoresist of the required thickness on the wafer.

That is, too much photoresist is sprayed on the wafer meaning that much of the photoresist is wasted. Such an economic loss is magnified considering the post-use treatment of the photoresist necessary to respond to environmental concerns.

Therefore, there is a great demand for a method of spraying photoresist which avoids wasting the photoresist.

SUMMARY OF THE INVENTION

An object of the present invention is to provide a photoresist coating apparatus and method wherein the photoresist is not wasted, i.e., which minimizes the amount of photoresist necessary to coat the wafer.

To achieve these and other objects, the present invention provides a coating apparatus that includes a linear driving mechanism operatively connected to the spray nozzle so as to move the nozzle in a radial direction of a wafer chucked to a rotary chuck. A variable speed motor is operatively connected to the rotary chuck for rotating the chuck. A controller adjusts the speed of the motor, based on the location of the nozzle, while the nozzle is moved by the linear driving mechanism in a direction from the peripheral edge of a wafer toward the center of the wafer.

The controller is configured such that the rotational speed of the motor is gradually increased linearly or non-linearly while the nozzle scans the wafer.

The photoresist coating method similarly includes steps of chucking a wafer to a rotary chuck; subsequently rotating the chuck at an initial speed; moving the spray nozzle radially across the wafer in a direction from the peripheral portion of the wafer toward a central portion of the wafer, to spray the wafer with photoresist; and increasing the speed at which the chuck is rotating while the nozzle is moved from the peripheral edge of the wafer toward its center.

BRIEF DESCRIPTION OF THE DRAWINGS

These and other objects, features and advantages of the present invention will become clearer from the following detailed description of the preferred embodiments thereof, made with reference to the accompanying drawings, of which.

DETAILED DESCRIPTION OF THE PREFERRED EMBODIMENTS

Figure 1:
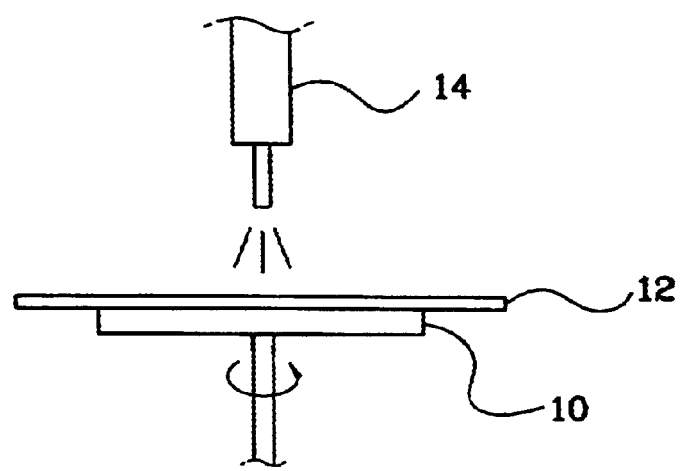
FIG. 1 is a schematic diagram of a conventional photoresist spin-coating apparatus.
Figure 2:
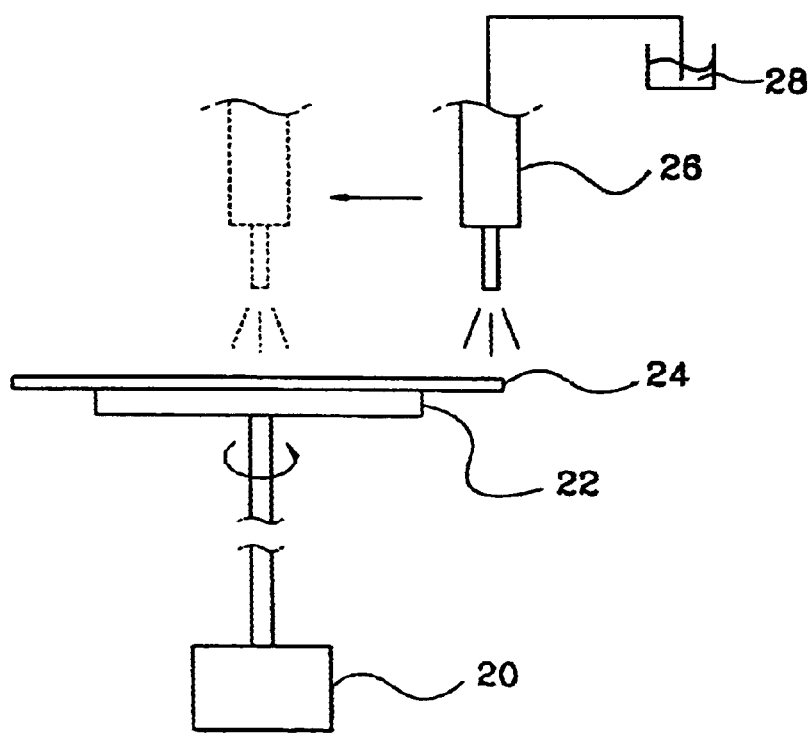
FIG. 2 is a schematic diagram of one embodiment of a photoresist spin-coating apparatus according to the present invention.

The photoresist coating apparatus of the present invention, as shown in FIG. 2, comprises a rotary chuck 22 on which a wafer 24 is mounted, a variable speed motor 20 which rotates the chuck 22, and a nozzle 26 mounted over the chuck 22 so as to be movable in a direction that scans the wafer 24 from its periphery to its center.

The rotary speed of the chuck 22 is different for each radial position, that is, each spraying position of the nozzle 26. The speed of the motor 20 is controlled according to the center-to-peripheral distance between the nozzle 26 and the motor 20. More specifically, the motor 20 is controlled to rotate the chuck 22 more rapidly when the nozzle 26 is over the center of the wafer than when the nozzle 26 is over the periphery of the wafer 24.

The rotary speed of the chuck 22 is thus increased (linearly or non-linearly) as the nozzle 26 scans the wafer 24 from its peripheral edge to its center. The exact manner in which the rotary speed of the chuck 22 is caused to increase can be set by the manufacturer.

Figure 3:
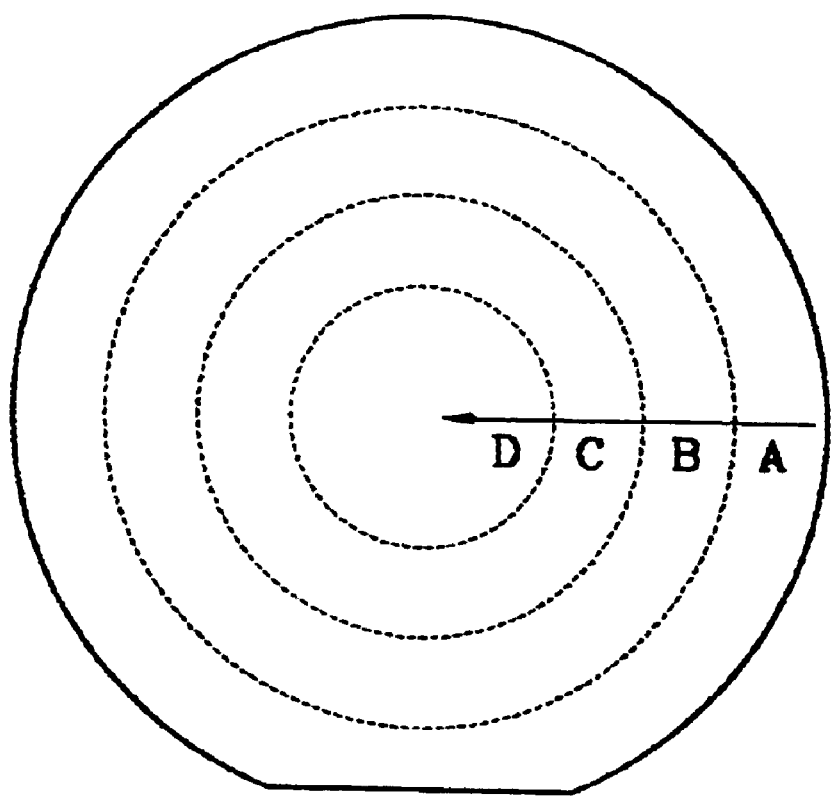
FIG. 3 is a top view of a wafer, showing the different sections of the wafer coated according to the method of the present invention.

According to one embodiment of the present invention as shown in FIG. 3, the planar surface of the wafer is divided into sections A, B, C, D. The speed at which the wafer is caused to rotate is increased as the nozzle progresses from one section to the next in the direction of the arrow. The increases in speed are selected to be linear in this case.

Figure 4:
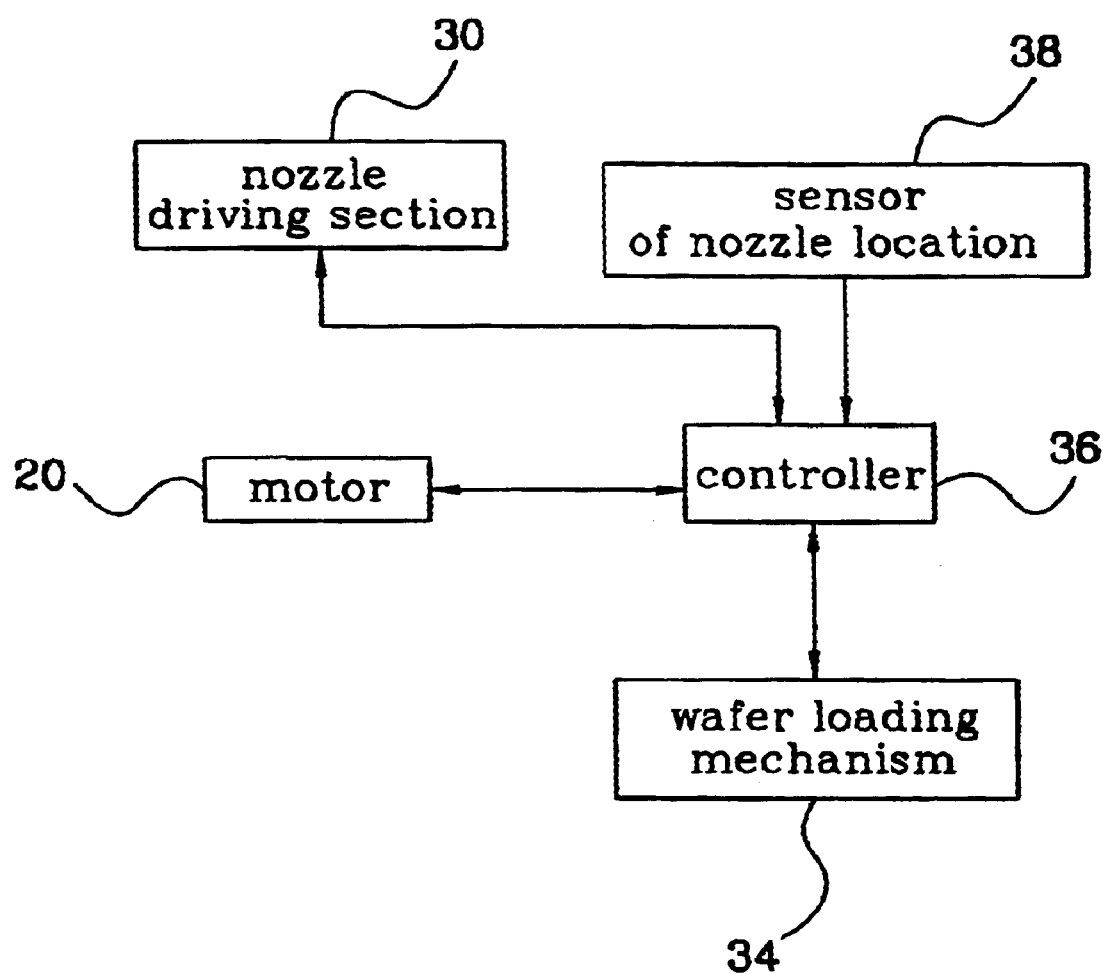
FIG. 4 is a block diagram of the control system of the photoresist spin-coating apparatus according to the present invention.

With reference to FIG. 3 and FIG. 4, note that the control system of the present invention is designed so that the motor 20 is responsive to the movement of the nozzle 26.

More specifically, a nozzle driving section 30, the motor 20, and a wafer loading mechanism 34 are interfaced with a controller 36. A nozzle location sensor 38 senses the location (spraying position) of the nozzle 26, generates a signal indicative thereof, and issues the signal to the controller 36. The nozzle driving section 30 can comprise a suitable known linear driving mechanism operatively connected to the nozzle 26. The controller 36 is, of course, a computer controller. As for the sensor 38, various sensors known in the art for detecting the position of a driven mechanical part can be used.

Now, a method of coating a wafer with photoresist according to the present invention will be described. The wafer loading mechanism 34 transfers the wafers one-by-one and deposits them individually on the rotary chuck 22, where each wafer is then chucked using a vacuum. The controller 36 controls the motor 20 to begin rotating the chuck 22. Once the chuck is rotating at an initial given speed, the controller controls the nozzle driving part 30 to move the nozzle 26 across the wafer, whereupon the spraying operation begins.

As the nozzle 26 is moved from a position above the periphery of the wafer (Sec. A in FIG. 3) toward its central portion (Sec. D in FIG. 3), the location of the nozzle is monitored by the nozzle location sensor 38.

The nozzle location sensor 38 issues a signal indicative of the location of the nozzle 26 to the controller 36. The controller 36 is designed to regulate the speed of the motor 20 according to the location of the nozzle 26. Specifically, the speed of the motor 20, and hence the rotational speed of the wafer 24 chucked on the rotary chuck 22, is increased as the nozzle 26 is moved toward a position over the central portion of the wafer.

If the initial speed of the motor 20 were maintained as the nozzle 22 for spraying the wafer with photoresist were moved in a direction from the periphery of the wafer toward its center, less photoresist would be used to coat the wafer than in the above-described case. However, the thicknesses of the photoresist as respectively taken at the periphery and at the central portion of the wafer would be different due to factors such as the differing linear speeds, centrifugal forces, and surface tensions at the various radial positions of the wafer. For example, the central portion of the wafer might not be coated at all or at most only partially coated because the photoresist would not adhere to the center of the wafer. In any event, the uniformity of the photoresist would be poor.

In order to resolve the problems associated with the above-described scenario, the motor 20 applies a varying rotational force to the rotary chuck 22, and the rotational speed of the wafer 24 is varied taking into consideration the mechanical engineering parameters, such as the centrifugal force and surface tension, existing at each section of the wafer shown in FIG. 3.

That is, the rotational speed is increased at each successive section, moving toward the center of the wafer, to ensure uniformity in the thickness of the photoresist considering that the centrifugal force and the surface tension differ amongst the various concentric sections of the wafer 24. The optimum speeds can be determined theoretically or experimentally.

Further, in order to ensure that the photoresist at the center of the wafer has a thickness sufficiently equal to that at the other portions of the wafer, the time during which the nozzle 26 sprays the central section of the wafer is increased (in a specific example by 0.2 sec.) above the time during which the nozzle remains above each of the other sections of the wafer.

According to the present invention, the amount of photoresist used to coat a wafer is about 4 cc less than that used by the prior art to coat the same wafer. In other words, the present invention requires less than half the amount of photoresist used by the prior art. Accordingly, the present invention is more economical and environmentally friendly than the prior art.

Furthermore, a photoresist applied to a wafer according to the present invention has a thickness that is more uniform than that produced according to the prior art.

Although the present invention has been described in detail, it is clear that various changes, substitutions and alterations can be made thereto without departing from the spirit and scope of the invention as defined by the appended claims.

What is claimed is:

1. A method of spin-coating a wafer with a photoresist, said method comprising:

chucking a wafer to a rotary chuck;

subsequently rotating the chuck at an initial speed;

positioning a spray nozzle above a peripheral portion of the wafer chucked to said rotary chuck;

moving the spray nozzle radially across the wafer in a direction from a peripheral portion of the wafer toward a central portion of the wafer;

spraying the wafer with photoresist with the spray nozzle as the spray nozzle is moved in said direction; and increasing the speed at which the chuck is rotating from said initial speed while the nozzle is moved in said direction from the peripheral portion of the wafer, wherein a spraying time during which the spray nozzle sprays the central portion of the wafer is greater than a spraying time during which the spray nozzle sprays each of other sections of the wafer.

2. A method of spin-coating a wafer as claimed in claim 1, and further comprising monitoring the location of the nozzle as the nozzle is moved across the wafer, and wherein said step of increasing comprises increasing the speed at which the chuck is rotating based on the location of said nozzle.

3. A method of spin-coating a wafer as claimed in claim 1, wherein said step of increasing comprises increasing the speed at which the chuck is rotating in a linear fashion.

4. A method of spin-coating a wafer as claimed in claim 2, wherein said step of increasing comprises increasing the speed at which the chuck is rotating in a linear fashion.

5. A method of spin-coating a wafer as claimed in claim 1, wherein said step of increasing comprises increasing the speed at which the chuck is rotating in a non-linear fashion.

6. A method of spin-coating a wafer as claimed in claim 2, wherein said step of increasing comprises increasing the speed at which the chuck is rotating in a non-linear fashion.

7. The method of spin-coating a wafer as claimed in claim 1, the spraying time during which the spray nozzle sprays the central portion of the wafer is 0.2 seconds greater than a spraying time during which the spray nozzle sprays each of other sections of the wafer.

* * * * *